(12) United States Patent
Railkar et al.

(10) Patent No.: US 8,468,754 B2
(45) Date of Patent: Jun. 25, 2013

(54) SHINGLED ROOF WITH INTEGRATED PHOTOVOLTAIC COLLECTORS

(75) Inventors: Sudhir Railkar, Wayne, NJ (US); Adem Chich, Kearney, NJ (US)

(73) Assignee: Building Materials Investment Corporation, Dallas, TX (US)

( * ) Notice: Subject to any disclaimer, the term of this patent is extended or adjusted under 35 U.S.C. 154(b) by 150 days.

(21) Appl. No.: 12/683,453

(22) Filed: Jan. 7, 2010

(65) Prior Publication Data

US 2010/0170169 A1 Jul. 8, 2010

Related U.S. Application Data

(60) Provisional application No. 61/143,235, filed on Jan. 8, 2009.

(51) Int. Cl.
*E04D 13/18* (2006.01)
*E04D 1/00* (2006.01)
*E04H 14/00* (2006.01)
*E04B 9/00* (2006.01)
*H02N 6/00* (2006.01)
*H01L 31/042* (2006.01)

(52) U.S. Cl.
USPC ............... 52/173.3; 52/478; 52/518; 52/553; 136/244

(58) Field of Classification Search
USPC ................. 52/173.3, 518–560, 478, 747.1; 136/243–265; 428/141, 143
See application file for complete search history.

(56) References Cited

U.S. PATENT DOCUMENTS

| | | | |
|---|---|---|---|
| 4,040,867 A * | 8/1977 | Forestieri et al. | 136/244 |
| 5,112,408 A | 5/1992 | Melchior | |
| 5,303,525 A * | 4/1994 | Magee | 52/306 |
| 5,437,735 A * | 8/1995 | Younan et al. | 136/251 |
| 5,575,861 A * | 11/1996 | Younan et al. | 136/251 |
| 5,768,831 A | 6/1998 | Melchior | |
| 6,311,436 B1 | 11/2001 | Mimura et al. | |
| 6,414,236 B1 | 7/2002 | Kataoka et al. | |
| 6,521,821 B2 | 2/2003 | Makita et al. | |
| 6,553,729 B1 * | 4/2003 | Nath et al. | 52/173.3 |
| 6,883,290 B2 * | 4/2005 | Dinwoodie | 52/748.1 |
| 7,178,295 B2 * | 2/2007 | Dinwoodie | 52/173.3 |
| 7,318,655 B2 | 1/2008 | Sooferian | |
| 7,328,534 B2 * | 2/2008 | Dinwoodie | 52/173.3 |
| 7,448,177 B2 | 11/2008 | McClintick | |
| 7,454,873 B2 | 11/2008 | McClintick | |
| 7,678,990 B2 * | 3/2010 | McCaskill et al. | 136/244 |

(Continued)

*Primary Examiner* — Andrew Triggs
(74) *Attorney, Agent, or Firm* — Womble Carlyle Sandridge & Rice, LLP

(57) ABSTRACT

A solar insert for shingled roofs includes an insert with a generally wedge-shaped body designed to be installed beneath a shingle and a face that is exposed and extends along a lower edge of the shingle. The face preferably is angled with respect to the shingle and a solar collector in the form of a thin-film solar strip is mounted to and extends along the face. The inserts of multiple shingles are electrically coupled together to form an electrical grid for aggregating the electrical energy of the individual solar collectors and delivering it to a remote location for storage or use. In a second embodiment, a shingle has a solar collector strip mounted to its surface extending along a forward edge of the shingle, and in another, the solar collector surrounds the tabs of their shingles. The solar collectors not only generate electrical energy from the sun; they also enhance the appearance of a shingled roof by providing a look of increased thickness and texture.

13 Claims, 9 Drawing Sheets

U.S. PATENT DOCUMENTS

| | | | |
|---|---|---|---|
| 7,678,991 B2 * | 3/2010 | McCaskill et al. | 136/244 |
| 2006/0032527 A1 | 2/2006 | Stevens et al. | |
| 2009/0000222 A1 * | 1/2009 | Kalkanoglu et al. | 52/173.3 |
| 2010/0170169 A1 * | 7/2010 | Railkar et al. | 52/173.3 |

* cited by examiner

SHINGLED ROOF WITH INTEGRATED PHOTOVOLTAIC COLLECTORS

REFERENCE TO RELATED APPLICATION

Priority is hereby claimed to the filing date of U.S. provisional patent application Ser. No. 61/143,235 filed on 8 Jan. 2009.

TECHNICAL FIELD

This disclosure relates generally to solar power and more specifically to photovoltaic solar collectors for placement on the shingled roof of a structure such as a residential home.

BACKGROUND

The trend toward alternate energy sources has lead in recent years to a demand for wind, geothermal, solar, hydrogen, and other sources of energy that do not derive from fossil fuels. The capturing of solar energy includes, without limitation, the collection and storage of heat from the sun and the collection and storage of electricity derived from sunlight. In the later case, photovoltaic solar cells and multi-cell solar panels have been developed that convert sunlight directly into electrical energy, which then may be used, stored in batteries, and/or placed back on the electrical grid. While solar panels are feasible in many applications, such as on industrial and commercial buildings, some consider them unsightly for use on roofs of residential homes. Further, traditional solar panels cover the shingles of a residential home, obscuring the architectural contribution of the shingles to the home. There is a need for a system for collecting solar energy from the roof of a residential home that is not unsightly and that is integrated into and actually enhances the architectural appearance of the shingles of the home. It is to the provision of such a system that the present invention is primarily directed.

SUMMARY

Briefly described, a solar collector, in one embodiment, comprises a relatively thin generally wedge-shaped solar insert configured to be installed or inserted beneath a traditional shingle. When installed or inserted, an exposed face of the insert extends along the forward edge portion of the shingle and is angled so that it can be exposed to sunlight. For new roofing installations, the inserts can be installed beneath shingles as they are installed on a roof. For existing roofing, the forward edge of shingles can be lifted up slightly and solar inserts can be slid under shingles and attached to the roof. The exposed angled face of each insert carries a photovoltaic solar collector, preferably in the form of a thin solar cell ribbon or strip mounted to and extending along the exposed face of the insert. An electrical grid installed on the roof couples electrically to the solar insert to receive electrical energy generated by the insert. An insert can be installed beneath the forward edge portion of each shingle on a roof or only selected shingles on a roof and all of the solar collectors are electrically coupled by the electrical grid to form a network that combines the electrical energy generated by the individual solar collectors. The individual solar collectors may be coupled in parallel, in series, or combinations thereof depending upon the desired voltage and/or current capabilities of the system. The generated electrical energy can be used to charge a battery bank, used directly to power electrical appliances in the home, or placed back on the public electrical grid for reimbursement by an electrical utility.

Significantly, it has been found that the exposed solar cell strips along and below the forward edges of the shingles do not detract from the architectural appearance of the roof. In fact, the black or dark blue solar collectors actually improve the look a shingled roof by enhancing the appearance of texture and thickness of the roofing shingles. In a second embodiment, a photovoltaic solar collector strip is applied directly to the surface of each shingle extending along and adjacent the exposed forward edge. The results are similar. The appearance of texture is enhanced while providing an effective solar array on the roof of a home. In yet another embodiment, a solar surround is configured to surround and project from beneath the tabs of architectural style shingles, again enhancing the appearance of depth in the shingles while exposing photovoltaic collectors of the surrounds to solar energy. The invention will be better understood upon review of the detailed description set forth below taken in conjunction with the accompanying drawing figures, which are briefly described as follows.

DETAILED DESCRIPTION

Figure 1:
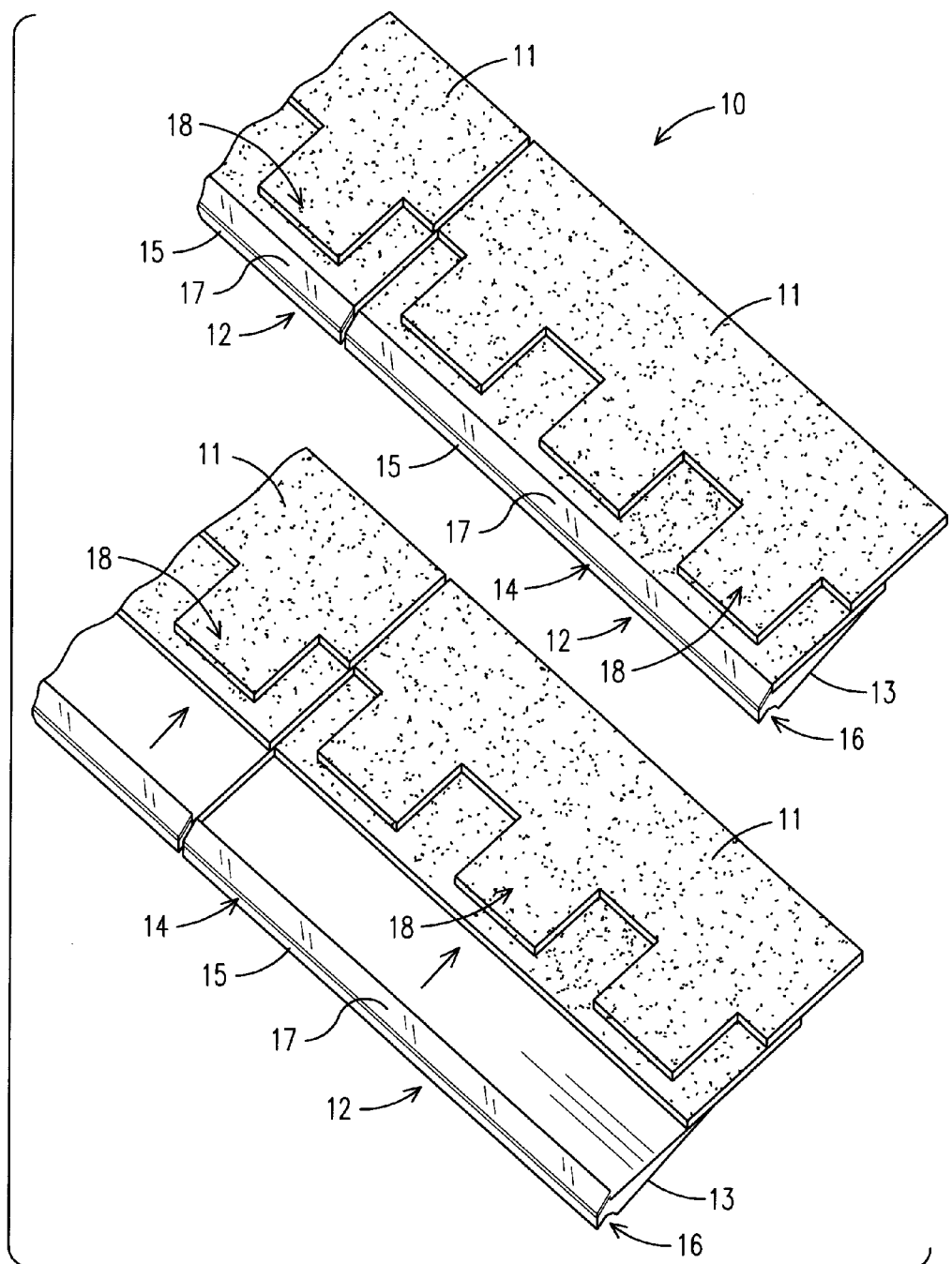
FIG. 1 is a perspective view of a section of a shingled roof illustrating the solar insert of this disclosure in one embodiment thereof.

Referring now in more detail to the drawing figures, wherein like parts are identified with like reference numerals throughout the several views, FIG. 1 illustrates one embodiment of a photovoltaic solar insert for shingle roofs according to the present disclosure. A roof 10 (only a small section of which is illustrated in FIG. 1) is covered with a plurality of shingles 11 arranged in overlapping courses and attached to the roof deck in the traditional manner. In FIG. 1, the roof shingles 11 are of the textured architectural style; however, the invention is not limited to such shingles and may be used with virtually any shingle type or style. Each of the shingles 11 has a forward edge portion 18 that overlies upper portions of shingles of the next lower course. The edge portions 18 of shingles in a course of shingles are generally aligned with one another.

A photovoltaic solar insert 12 configured according to the present disclosure is disposed beneath each of the shingles 11. Each solar insert 12 comprises a relatively narrow generally wedge-shaped body 13 that is disposed beneath the corresponding shingle 11 and extends from its apex beneath the body of the shingle downwardly toward the forward edge portion 18 of the shingle. It will thus be seen that the shingle rests on the narrow wedge-shaped insert in such a way that its forward edge portion 18 is raised up and spaced from the next lower course of shingles. The insert 12 further comprises an angled face 14 that extends at an angle downwardly from the forward edge portion 18 of the corresponding shingle toward the shingles of the next lower course. In this embodiment, a skirt 15 depends from the lower edge of the angled face 14 to rest upon a shingle 11 of the next lower course, thereby supporting the insert and the weight of the overlying shingle.

A photovoltaic solar cell, preferably in the form of a thin film photovoltaic strip or ribbon 17, is mounted to and extends along the angled face 14 of the body so that the solar cell is exposed just beyond and beneath the forward edge of the corresponding shingle. Solar thin film photovoltaic materials suitable for use with the insert are commercially available from a variety of sources such as, for example, Ulbrich Photovoltaic located in Westminster, S.C. and others. The angle of the face 14 is preselected so that the solar cell 17 is advantageously oriented for the most direct solar exposure so that each solar cell can produce the most possible electrical energy. Further, this angle may be different for different roof pitches and can vary depending upon whether the roof deck faces south, east, or west. North facing roof decks (or south facing in the southern hemisphere) typically receive little solar exposure and may not be provided with functioning solar inserts. However, for architectural consistency, north facing portions of a roof may be provided with non-functioning inserts that mimic the look of functioning solar inserts.

In the embodiment of FIG. 1, a ventilation opening or slot 16 preferably is formed in the body 13 of the insert to permit ventilation beneath the shingle and beneath the forward face 15 of the insert for cooling the solar collector 17 and preventing excessive heat buildup beneath the shingles. In the illustrated embodiment, a skirt 15 depends from the lower edge of the forward face 14 and rests on the next lower course of shingles to support the forward face 14 of the insert and the weight of the shingle resting atop the insert. Weep holes (not shown) may be formed along the bottom edge of the skirt if desired to allow water that may condense or be blown beneath the shingle to flow out through the weep holes. Further, as detailed below, ventilation openings may be formed along the skirt 15 to permit ventilation along the front of the insert.

It will be recognized that with the solar insert 12 disposed as described, the forward edge portion 18 of each shingle is lifted up slightly and rests on the solar insert as previously mentioned. This has been found to enhance the appearance of thickness and texture of the shingles beyond that provided by the shingles alone. Further, the exposed solar cell strip 14, which generally is black or very dark blue, is visible from the ground along the bottom edge of each shingle. This provides an even more enhanced perception or appearance of thickness and texture by, among other things, mimicking shadows along the lower edges of the shingles. Thus, not only are the solar inserts of this invention not unsightly as can be the case with prior art solar panels, they actually enhance the architectural appearance of a shingled roof and can make a less expensive shingle installation appear rich, textured, and more expensive.

With functional solar inserts installed beneath each or at least most or some of the shingles of a shingled roof as illustrated in FIG. 1, there is a substantial total composite area of solar collector exposed to sunlight. Each solar insert generates a relatively small amount electrical power from the sunlight falling on its solar collector. However, with all of the solar cells of all of the functioning inserts on a roof electrically connected together through an electrical grid, as described in more detail below, the total combined electrical energy generated can be hundreds of times that generated by a single insert and can be comparable to that of traditional solar panels. As further detailed below, the electrical grid and individual insert connectors can be configured so that the collectors are electrically connected in series, in parallel, combinations thereof, or otherwise to produce the desired final voltage and current capabilities. The electrical energy is collected by the electrical grid and is delivered to a remote location, where it can be used to charge the batteries of a battery bank, to power electrical equipment, or sold to an electrical utility by being placed back on the public electrical grid.

Figure 2:
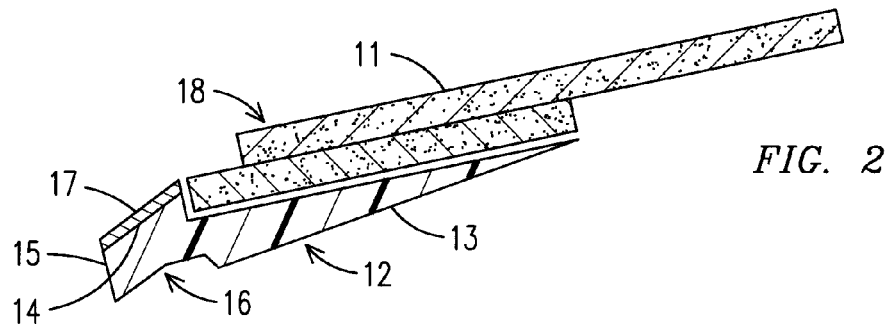
FIG. 2 is a side elevational view showing the solar insert disposed beneath a shingle with its exposed face and solar collector exposed along the forward edge portion of the shingle.

FIG. 2 shows the solar insert of FIG. 1 in a side view disposed beneath a shingle 11. The wedge-shaped body portion 13 of the solar insert 12 is seen disposed mostly beneath the forward edge portion 18 of a shingle 11 (although it may be alternatively sized and configured to extend farther toward the back of the shingle if desired). It also is clear in FIG. 3 that this raises the forward edge portion of the shingle above the shingles in the next lower course, which generally are disposed beneath the solar insert 12. The forward part of the solar insert is configured to define the angled face 14 that extends along and below the forward edge of the shingle 11. Photovoltaic solar collector 17 is mounted to the forward face of the insert as shown so that it is exposed to sunlight. Preferably, but not necessarily, the angle of the surface 14 upon which the solar collector 17 is mounted is predetermined for a particular installation so that the solar collector 17 receives the most direct sunlight in order to produce the most possible electrical energy. As mentioned, this angle may be different for roof installations of different pitches or exposures. The inserts 12 can be fabricated in a variety of available configurations to suit most roofing installations, or can be custom designed and fabricated for a particular roofing installation if desired.

With continuing reference to FIG. 2, the body 13 further includes skirt 15 that depends from the angled face 14 of the insert and rests on a shingle or shingles of the next lowest course of shingles. This both supports the angled face 14 and solar collector 17 and keeps them from sagging, and also provides support for the weight of the shingle 11 resting atop the solar insert. The vent slot 16 in this embodiment, which is shown more clearly in FIG. 2, provides a passage for air to enter beneath the shingle 11, the angled face 14, and the solar collector 17 thereon to prevent excessive heat from building up beneath the shingle 11 and to provide a measure of cooling to the solar collector. While one possible configuration of the vent slot 16 is illustrated in FIG. 2, it will be understood that it may take on numerous other configurations or may be located other than where shown in FIG.2 without departing from the spirit and scope of the invention. For example, an alternate embodiment with vent slots along the skirt 15 is described in more detail below.

The solar insert of FIGS. 1 through 2 can be fabricated in a variety of alternate configurations within the scope of the invention. For example, the body 13 can be fashioned as a wedge with a top panel that resides beneath and supports the weight of the shingle above. Alternatively, it can be fashioned with a series of wedge-shaped ribs or buttresses that extend inwardly from the ends of the angled face 14 at predetermined intervals therealong. The solar insert of this disclosure may be fabricated from any of a variety of materials so long as the selected material is capable of withstanding the heat, ultraviolet radiation, weather, and temperature variations to which roofs commonly are exposed. For example, certain plastics may be suitable as has been the case with ridge and roof vents, flashing, and the like commonly installed on roofs. Alternatively, the inserts may be formed of metal such as aluminum or stainless steel, or they may be formed as a solid molded piece of a polymer-filler composite, which may be blown to reduce needed material and weight of the inserts. These and other fabrications may be applied to make the solar inserts of this disclosure, all within the scope of the invention.

It will further be understood that the solar inserts of FIGS. 1 and 2 can be installed in a variety of ways. For instance, they can be provided as individual inserts that are installed as part of and in conjunction with the installation of the shingles. In such an installation, a plurality of solar inserts may be affixed to the roof extending along and atop each course of shingles as the course is installed so that the next higher course can be installed atop the inserts. Alternatively, the solar inserts can be pre-fabricated as an integral part of each shingle such that courses of shingles can be installed substantially in the traditional manner by a roofer, which, at the same time, accomplishes the installation of the solar inserts beneath each course. Finally, an embodiment of the insert is envisioned that can be slipped beneath an existing roofing installation; however, this presents certain challenges not present in new installations.

The solar insert of FIGS. 1 and 2 is well suited to new roofing installations in which the inserts can be installed concurrently with the shingles or provided as an integral component of shingles. However, it may not be as appropriate for retrofitting existing roofs because, among other things, shingles of adjacent courses can become brittle and fused together over time and may not separate easily to receive inserts without damage.

Figure 3:
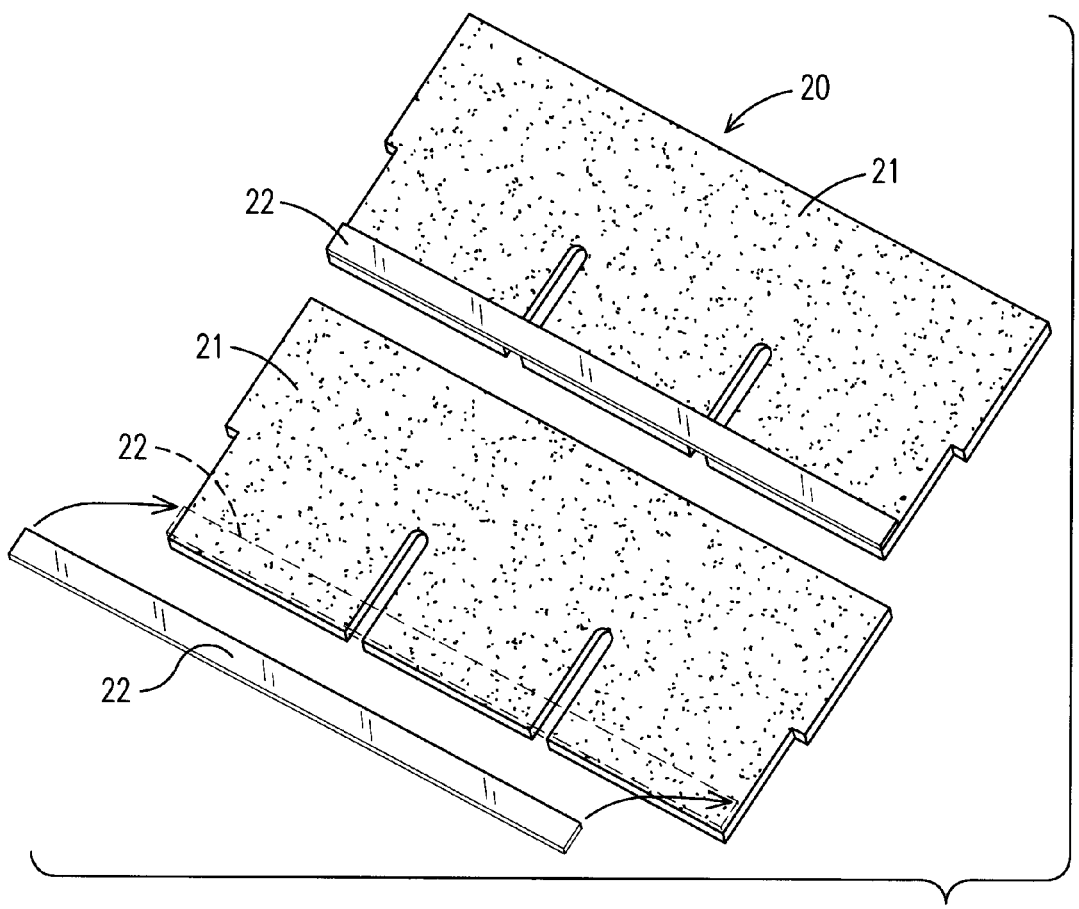
FIG. 3 is a perspective view of an alternate embodiment of a photovoltaic solar collector attached to a shingle according to the disclosure.
Figure 4:
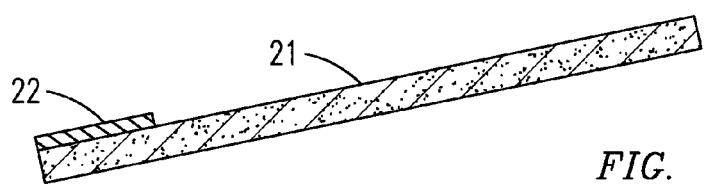
FIG. 4 is a side elevational view of the alternate embodiment of FIG. 3 illustrating the solar collector extending along the exposed forward edge of a roofing shingle.

FIGS. 3 and 4 illustrate an embodiment of the present invention that perhaps is better suited for application to existing shingled roofs. Here the roof 20 is shingled with traditional three-tab asphalt shingles 21 applied in overlapping courses. Solar collectors in the form of thin-film photovoltaic strips 22 are mounted and secured to each (or most or some) of the shingles 21 extending along the exposed edge portions thereof. The solar collector may, if desired, be slightly spaced from the extreme edges of the shingles. Alternatively, the collectors may be affixed to the shingles such they extend completely to the extreme edges of the shingles, as illustrated in phantom lines along the lower shingle in FIG. 3. With this embodiment, the solar collector strips may be applied by an installer by securing the strips to the shingles with an appropriate adhesive and interconnecting the strips with a wiring harness forming an electrical grid. The hundreds of solar cell strips 22 then become electrically interconnected to deliver electrical power to a battery bank, electrical appliances, to the public grid, or otherwise. As with the prior embodiment, the solar cell strips 22 typically are black or very dark blue. As a result, it has been found that the embodiment of FIG. 3 also provides a shingled roof with the impression of thickness and texture reminiscent of that provided by the embodiment of FIGS. 1 and 2, enhancing the appearance of the roof.

FIG. 4 is a side elevational view of the embodiment of FIG. 3 showing a shingle 21 with a solar collector strip 22 applied along the exposed edge thereof. In FIG. 4, the solar collector 22 is applied immediately adjacent to the exposed edge of the shingle; however, it may be slightly spaced from the exposed edge if desired. Either or an alternate placement is possible and within the scope of the invention.

Figure 5:
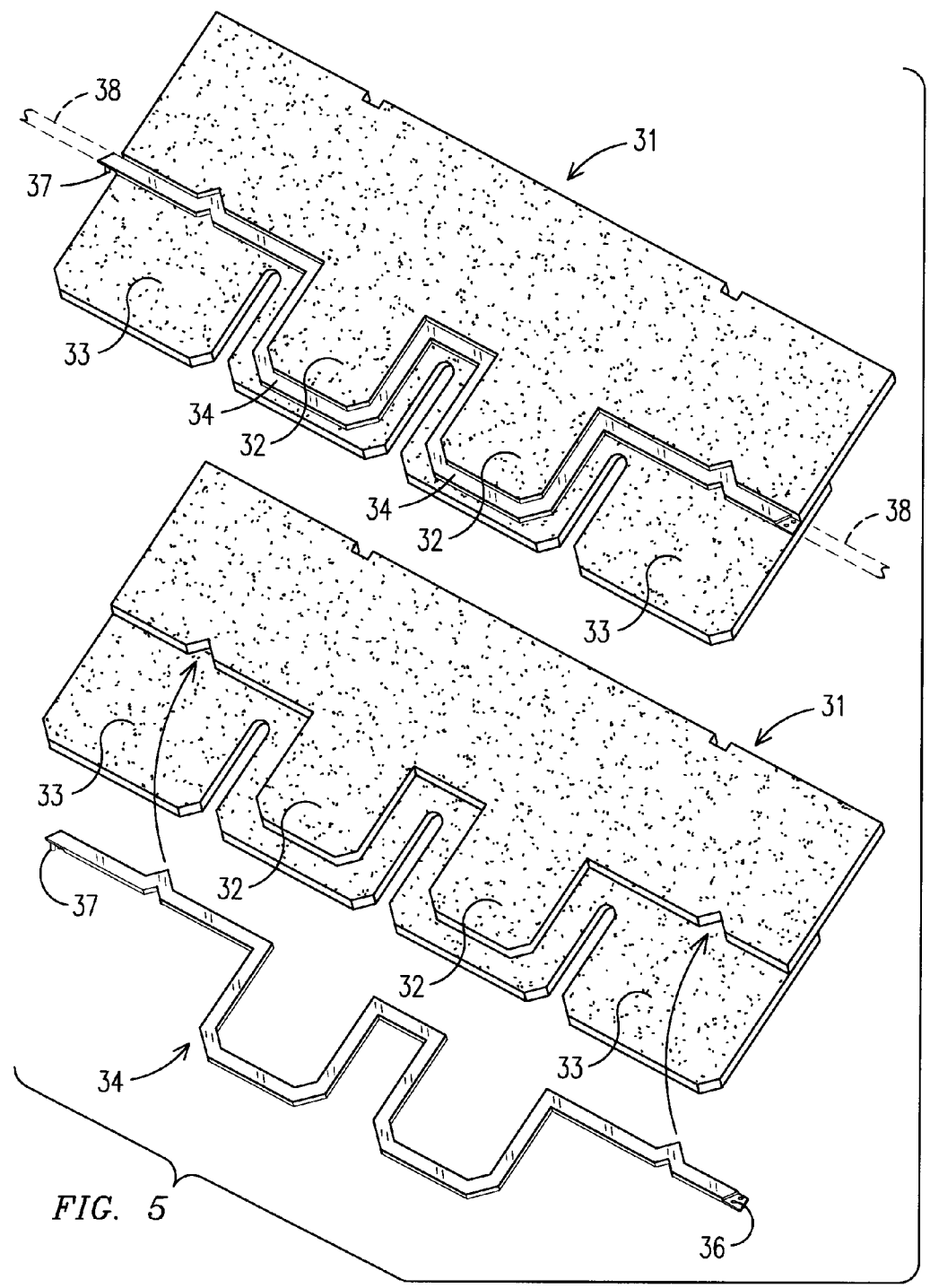
FIG. 5 illustrates another embodiment of a solar collector according to the disclosure in the form of a solar surround that projects from beneath and surrounds the tab edges of architectural shingles.

FIG. 5 illustrates an alternate embodiment of a solar collector for shingled roofs according to the invention. This embodiment is particularly suited to high end architectural shingles such as Camelot® brand shingles available from GAF Materials Corporation, and will be described herein in the context of such. However, it certainly is not limited to use with high end architectural shingles and may be applied to other types of shingles as well. Referring to FIG. 5, an architectural shingle 31 is formed from a top shingle layer having tabs 32 (also referred to as dragon teeth) that overly larger tabs 33 on a bottom layer of shingle material. The corners of the tabs 33 are angled to provide a sense of thickness and texture. Since the dragon teeth 32 are smaller than the bottom tabs 33, a portion of each bottom tab is visible around the periphery of an overlying dragon tooth tab.

According to the invention, a solar collector or solar surround 34 is shaped in a generally saw-tooth pattern and is sized to be installed on the shingle 31 such that it surrounds and boarders the dragon teeth and the lower edges of the upper shingle layer, as illustrated on the left in FIG. 5. The surface of the solar surround is covered with photovoltaic collectors, which, again, may take the form of solar ribbon or other appropriate material. Preferably, the solar surround is provided with mating electrical connectors 36 and 37 on its ends so that the solar surround can be connected electrically to solar surrounds 38 of adjacent shingles in a course. The courses of solar surrounds can then be electrically connected through a harness, batten, or other connector at a preselected location on the roof for delivering electrical energy from all of the solar surrounds to a central location. The shape of each solar surround provides increased surface area for the collection of solar energy. Further, the surround has been found to enhance the appearance of a shingled roof by, among other things, enhancing the appearance of thickness and texture of the shingles.

Figure 6:
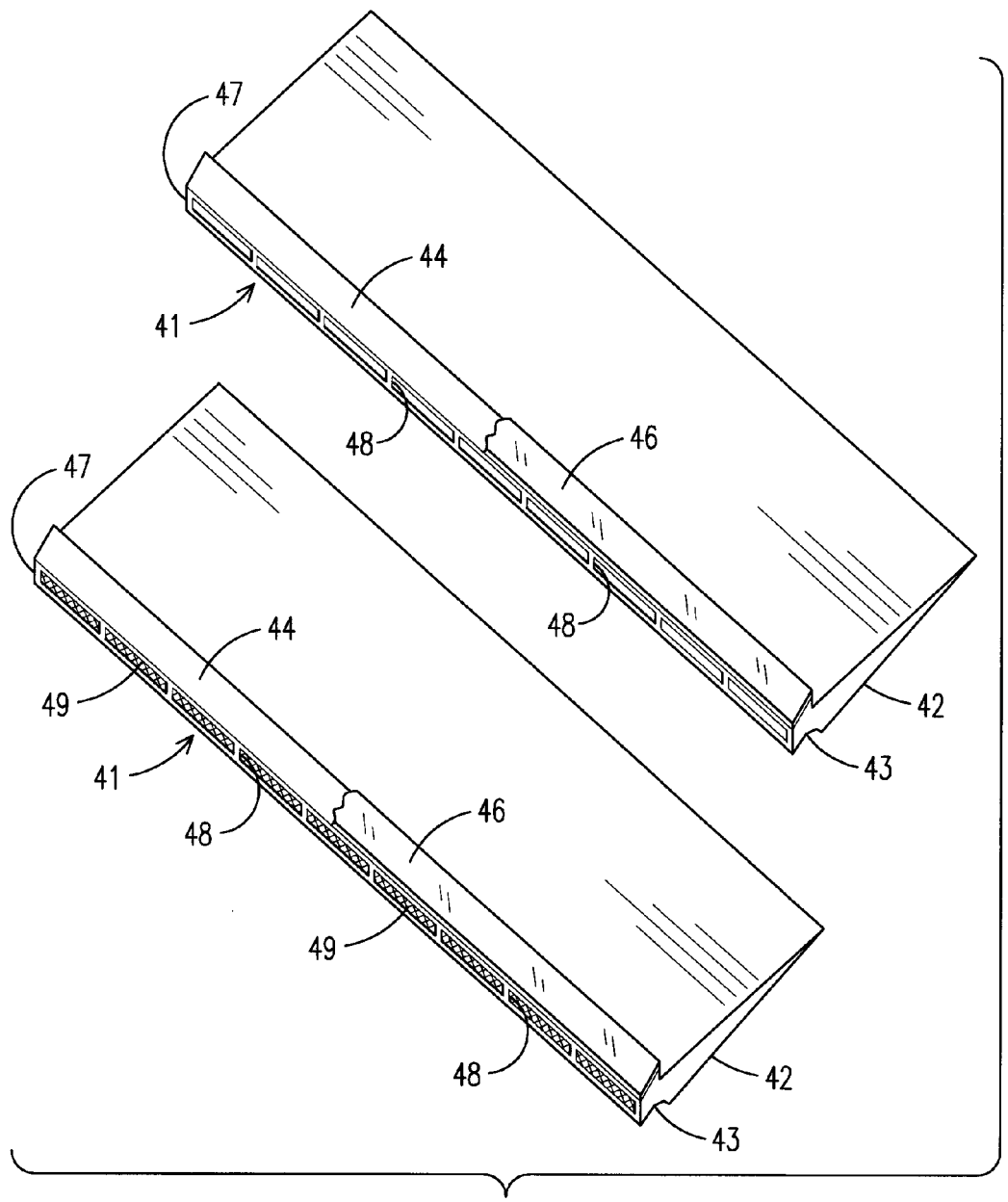
FIG. 6 is a perspective partially exploded view of an alternate embodiment of the insert of FIG. 1 having ventilation slots formed along its skirt.

FIG. 6 illustrates an alternate embodiment of a solar insert that is similar in many respects to the solar insert of FIG. 1. The insert 41 has a wedge-shaped body 42, a side vent 43, and an angled face 44 that is covered with a photovoltaic collector 46. As with the prior embodiment, a skirt 47 depends from the angled surface 44 and is configured to rest on a shingle of the next lower course of shingles. In this embodiment, the skirt 47 has an array of vent openings 48 formed therealong for allowing ventilation through the forward edge of the solar insert. The vent openings 48 may be spanned by a screen material 49 to prevent migration of insects beneath the shingles, as illustrated in the lower image of FIG. 6. Alternately, the vent openings 48 may be open and a filter material such as, for instance, Cobra® venting material available from GAF Materials Corporation may be disposed behind the solar insert to resist insect and water infiltration. Other options such as lovers, baffles, and the like also are possible and within the scope of the invention. The front vented solar insert of FIG. 6 provides enhanced ventilation for minimizing heat buildup beneath the shingles and for cooling the solar collectors of the inserts.

Figure 7:
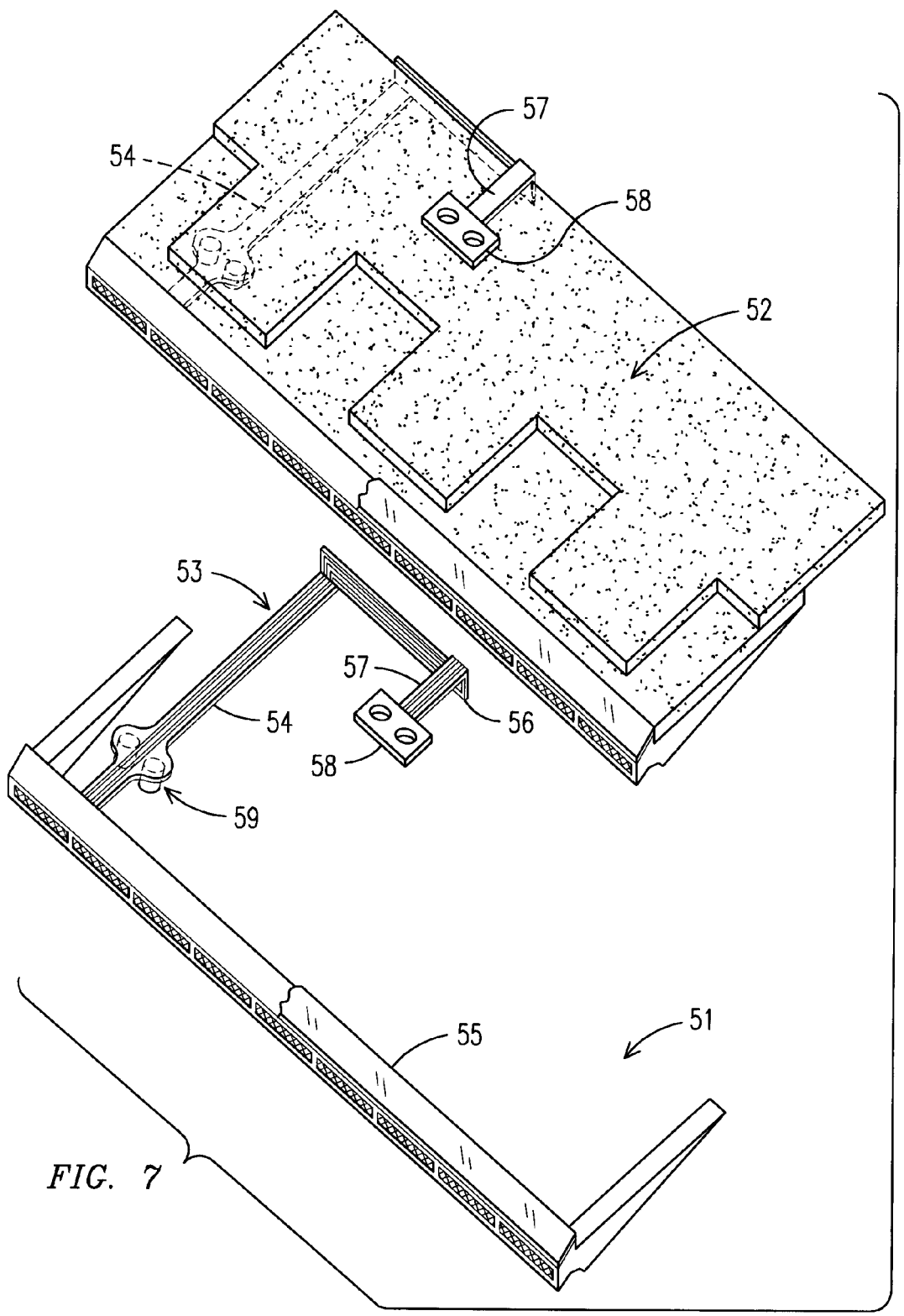
FIG. 7 illustrates a solar insert according to the disclosure with one possible system for wiring multiple inserts electrically together during installation.
Figure 8:
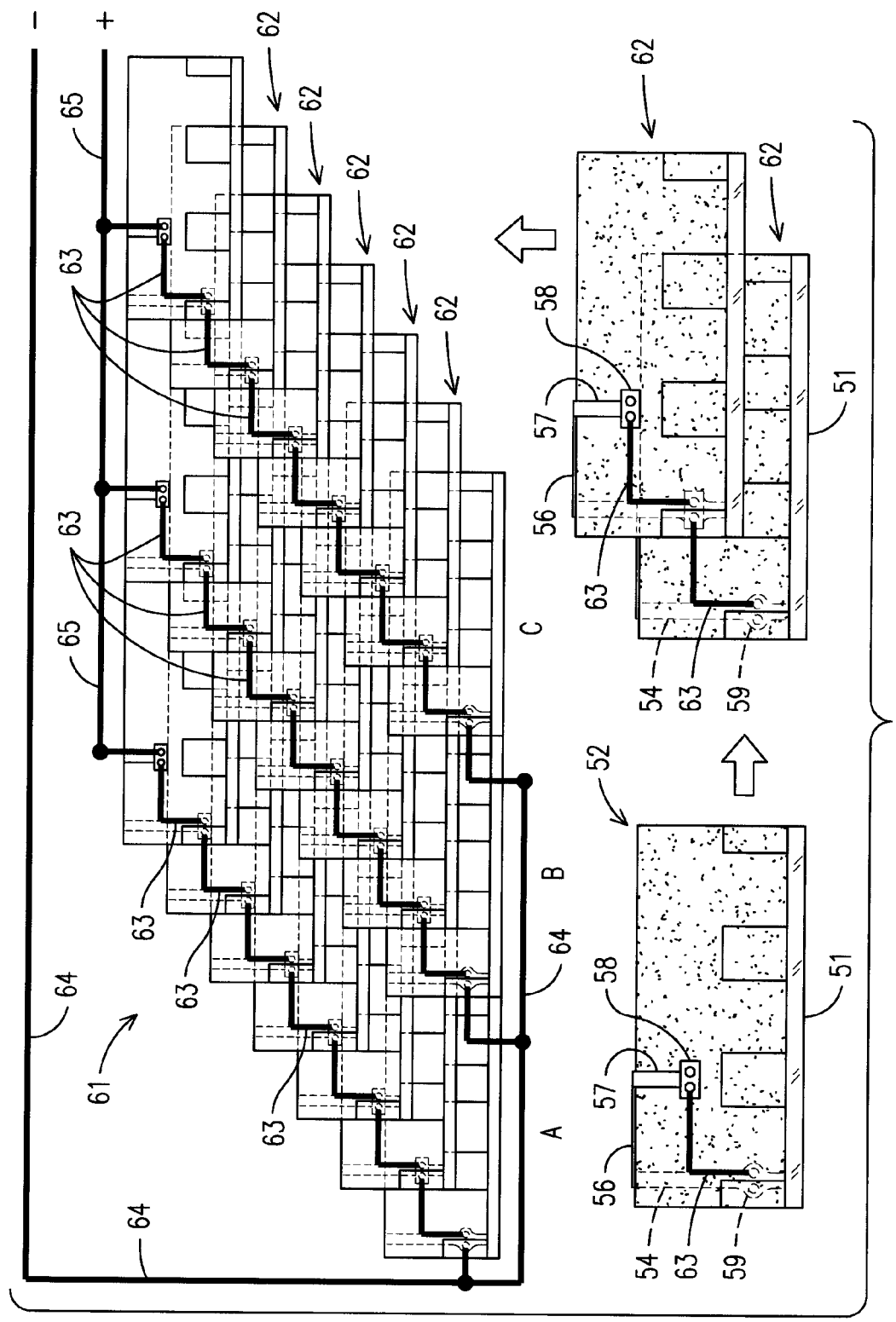
FIG. 8 illustrates an array of solar inserts with electrical connections as shown in FIG. 7 wired so that the collectors are connected in series with each other.

With an array of solar inserts of this invention installed beneath shingles of a roofing installation, the individual solar collectors of the inserts must be electrically coupled together in a grid for collection and delivery of electrical energy to a usable location. While many configurations of electrical grids are possible, FIGS. 7 and 8 illustrate one configuration considered by the inventors to represent a best mode of carrying out the invention. FIG. 7 illustrates a single shingle 52 and solar insert 51 generally of the type described above. The lower image in FIG. 7 illustrates the solar insert separated from the shingle, while the upper image shows it mounted beneath the shingle. As mentioned, the insert can be fabricated at the manufacturer as an integral part of the shingle, the entire unit to be installed by a roofer, or the insert may be installed by a roofer or installer in the field. In any event, one or more of the terminals of the photovoltaic collector 55 are electrically connected at the angled surface of the insert to an electrical harness 53. In the illustrated embodiment, the harness 53 may be configured as a flat or ribbon conductor, which houses and insulates one or more wires. The harness 53 has a lower leg 54 that extends rearwardly from the front of the insert 51. The harness is then angled upwardly to form a transition portion 56 at it's rear end and then angled forwardly to form a shorter upper leg 57.

The upper leg 57 terminates in an electrical connector 58, which, in the illustrated embodiment, comprises a female connector. A mating electrical connector 59, which is illustrated as a male connector, is coupled to or formed with the lower leg 54 of the harness and extends downwardly therefrom. The harness is formed such that the connectors 58 and 59 are offset from each other along the length of the shingle to facilitate staggered installation of shingles in adjacent courses, as detailed below. As illustrated in the upper image of FIG. 7, when the solar insert 51 is mounted beneath the shingle 52, the lower leg 54 of the harness extends rearwardly beneath the shingle to is back edge. There, the transition portion 56 extends upwardly around the back edge of the shingle, and the upper leg 57 of the harness extends along the top of the shingle toward its front edge. This positions the female connector 58 at the end of the upper leg 57 atop the shingle in a location that will be covered by an adjacent shingle in the next higher course of shingles. The male connector 59, in turn, is positioned on the bottom side of the shingle extending downwardly therefrom. As mentioned, the connectors are staggered with respect to each other.

FIG. 8 illustrates one possible installation and connection option for installing shingles with solar inserts of the type shown in FIG. 7. Preferably, but not necessarily, the solar inserts are installed during manufacturing as integral parts of the shingles so that installation of the shingles accomplishes simultaneous installation of the solar inserts. The lower left image of FIG. 7 illustrates a single shingle 52 with solar insert 51, lower leg 54 of the electrical harness, transition portion 56, and upper leg 57, as illustrated in FIG. 7. Female connector 58 is exposed on the top of the shingle and male connector 59 is disposed on the bottom of the shingle and the connectors are offset from each other as described. For the particular electrical grid option illustrated in FIG. 8, the positive terminal of each male connector of an insert is electrically connected through the harness to the negative terminal of the corresponding female connector of the insert. This is illustrated by the dark connection lines 63 throughout the images of FIG. 8.

The lower right image of FIG. 8 illustrates two shingles 52 as described installed in two courses 62. For installation, the male electrical connector 59 on the bottom of the upper shingle is aligned and snapped or otherwise electrically coupled to the female connector 58 of the lower shingle. Since the connectors are offset as described, this action automatically staggers the upper shingle with respect to the lower shingle by the appropriate amount to prevent seams between shingles from lining up, which can cause leaks. Once the electrical connectors are coupled and the shingles aligned, the upper shingle can be secured to the roof deck in the traditional way, whereupon additional shingles are installed in the same and successive courses in the same manner.

The upper image in FIG. 8 illustrates a larger section of a shingled roof with a plurality of shingles of this invention installed and their solar inserts connected electrically as described. The solar inserts are omitted in this image for clarity, but it will be understood that they are nevertheless present. Because of the configuration of connections 63, the solar insert and collector of each shingle becomes electrically coupled in series fashion to the immediately overlying and staggered shingle of the next higher course of shingles. The end result is a number of adjacent and angled electrical circuits incorporating the solar collectors of numerous shingles and extending from the lower edge of the roof to the ridge of the roof, the three circuits visible in FIG. 8 being labeled A, B, and C respectively. Since each circuit A, B, and C includes numerous solar collectors electrically coupled in series, the total voltage produced by each circuit is substantially the sum of the voltages produced by the individual solar collectors in the circuit. Thus, this type of circuit can result in a solar collection system that produces relatively high voltages.

With continued reference to FIG. 8, it will be seen that each independent circuit A, B, and C are electrically coupled together in parallel through electrical trunk lines 64 and 65, which deliver electrical energy from the grid to a remote location for storage or use. This parallel connection of the circuits A, B, C, etc. retains the voltage level produced by the individual circuits, but multiplies the current delivery capacity of the individual circuits.

It will be understood that the circuit configuration shown in FIG. 8 is but one of many possible configurations that might be accomplished with the present invention. For example, if the male and female connector terminals are connected positive to positive and negative to negative, the result will be circuits A, B, C, etc. of parallel connected solar collectors, which can be connected by trunk lines at the ridge of the roof (or elsewhere) either in series or parallel as desired to obtain the desired voltage and current delivery capacity (i.e. the desired available power). The invention is not limited to any particular configuration of electrical grid configuration and includes all. The configuration of FIG. 8 is illustrated to show both series connection of solar collectors in a circuit and parallel connection of circuits of collectors.

Figure 9:
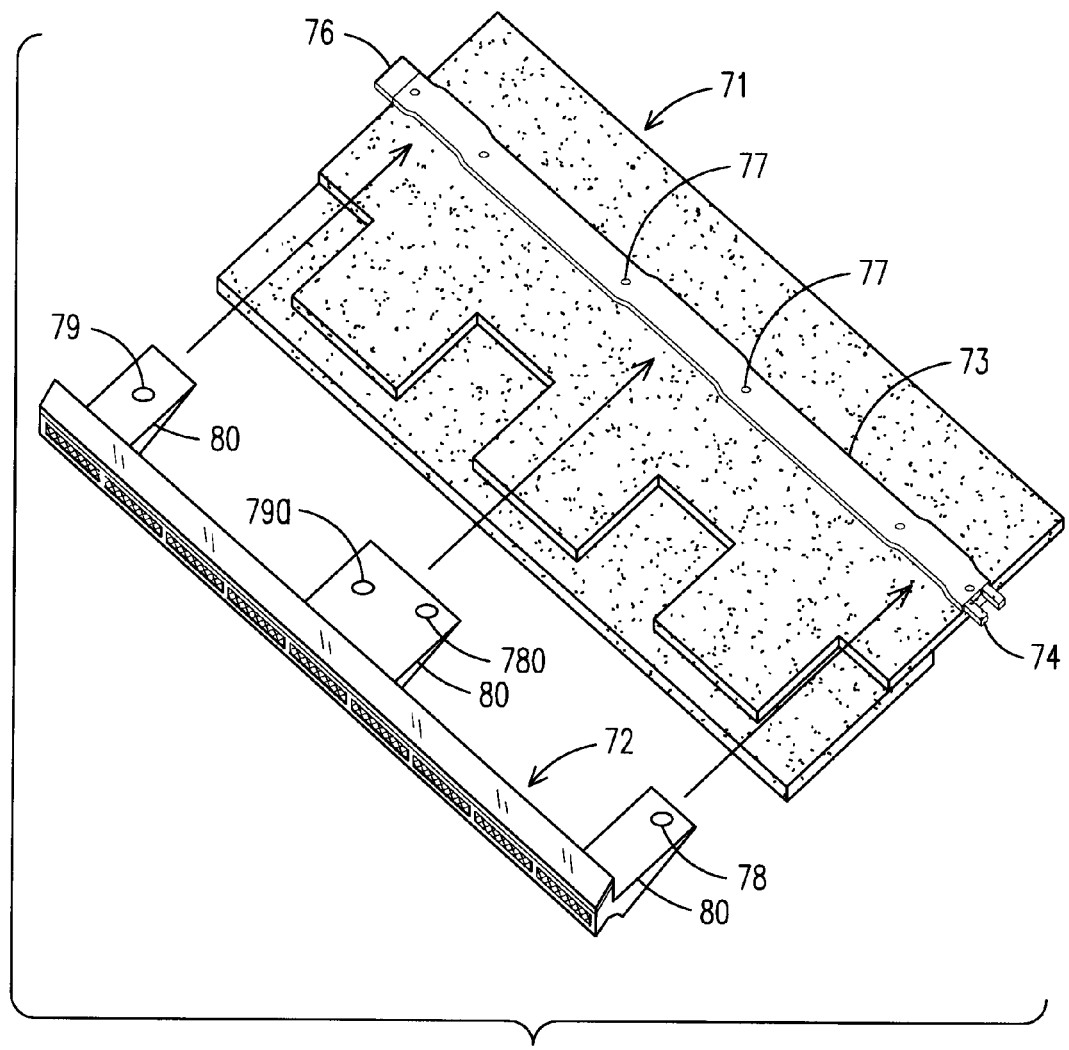
FIG. 9 illustrates an alternate system for connecting solar inserts to an electrical grid during installation.

FIG. 9 illustrates an alternate embodiment for connecting the solar collectors of inserts together in a grid that perhaps is best suited for installation of solar inserts in the field by roofers or installers. In this embodiment, a connector strip 73 carrying a pair (or more) of connectors is nailed along a course of shingles 71 in a region that will be covered by the shingles of the next higher course of shingles. The connector strips have mating electrical connectors 74 and 76 on opposite ends so that successive strips can be electrically connected together to span the entire (or a desired portion of the) length of a course of shingles. The solar insert 72 in this embodiment is provided with tabs 80 sized and positioned to be slid under the connector strip during installation of the solar insert. One or more of the tabs 80 are provided with electrical connectors 78 and 79 or 78a and 79a adapted to be coupled electrically to the strip 73. The electrical connectors may be of any appropriate type such as screw connectors, snap connectors, puncture connectors, or otherwise. When the inserts 72 are installed, the solar collectors of each course of shingles are connected together through the corresponding connector strip 73. The connector strips, in turn, can be connected electrically in parallel, series, or otherwise as needed or desired to form the electrical grid.

Figure 10:
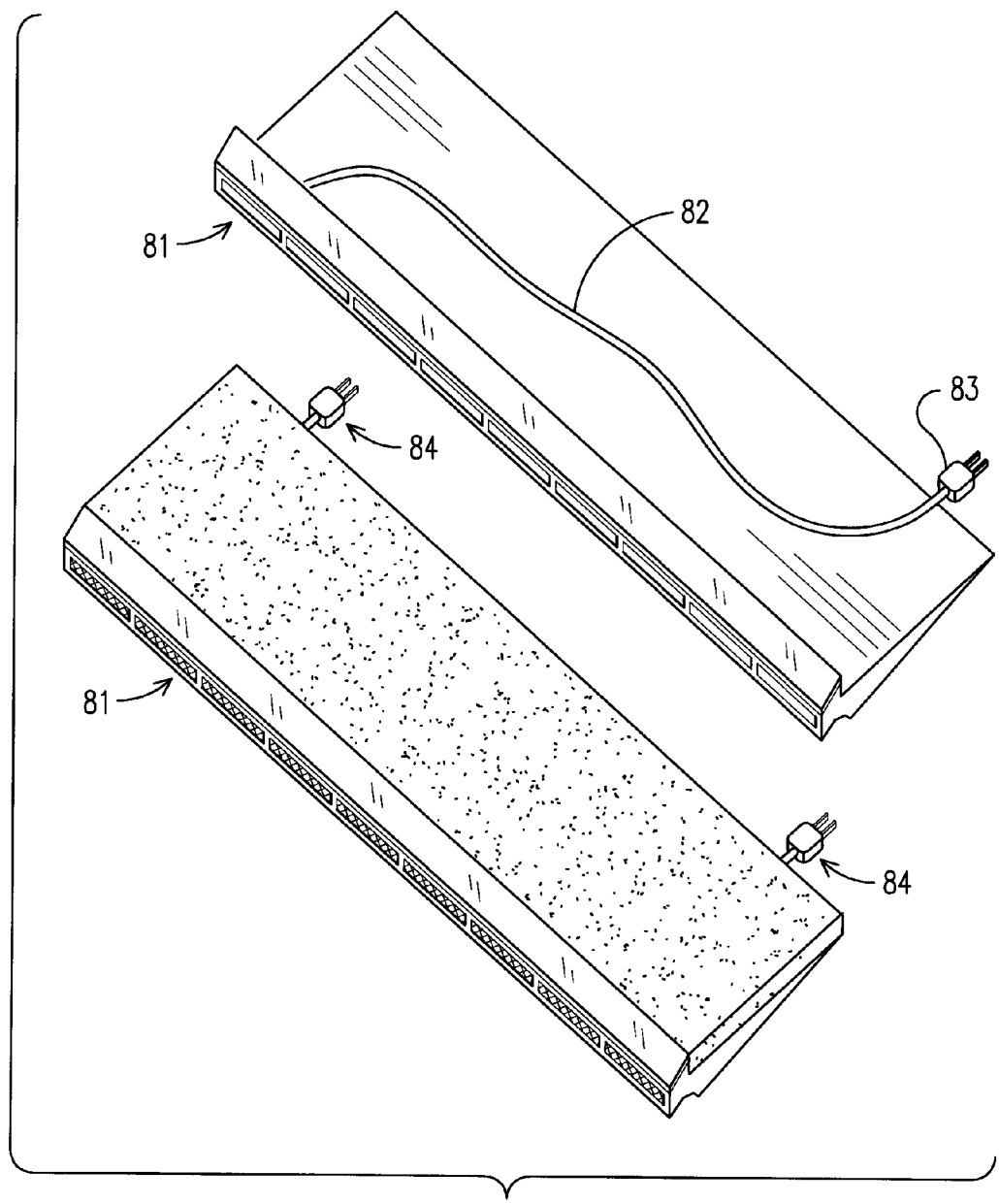
FIG. 10 illustrates yet another alternate system for connecting solar inserts to an electrical grid during installation.

FIG. 10 illustrates still another alternate electrical connection methodology wherein wires 82 connect the terminals of solar connectors to electrical plugs or connectors 83 at the free ends of the wires. The plugs can be progressively interconnected by an installer during roof installation and the wires can lie beneath the shingles extending up the roof to the ridge, where they are sheltered from the weather. They can then be inserted into the attic through the roof ridge, where they can be interconnected as desired to deliver power to a remote location. In this embodiment, the plugs 83 also can be conjured to be plugged into a connector strip or other grid element to couple each solar insert to a corresponding electrical grid.

Figure 11:
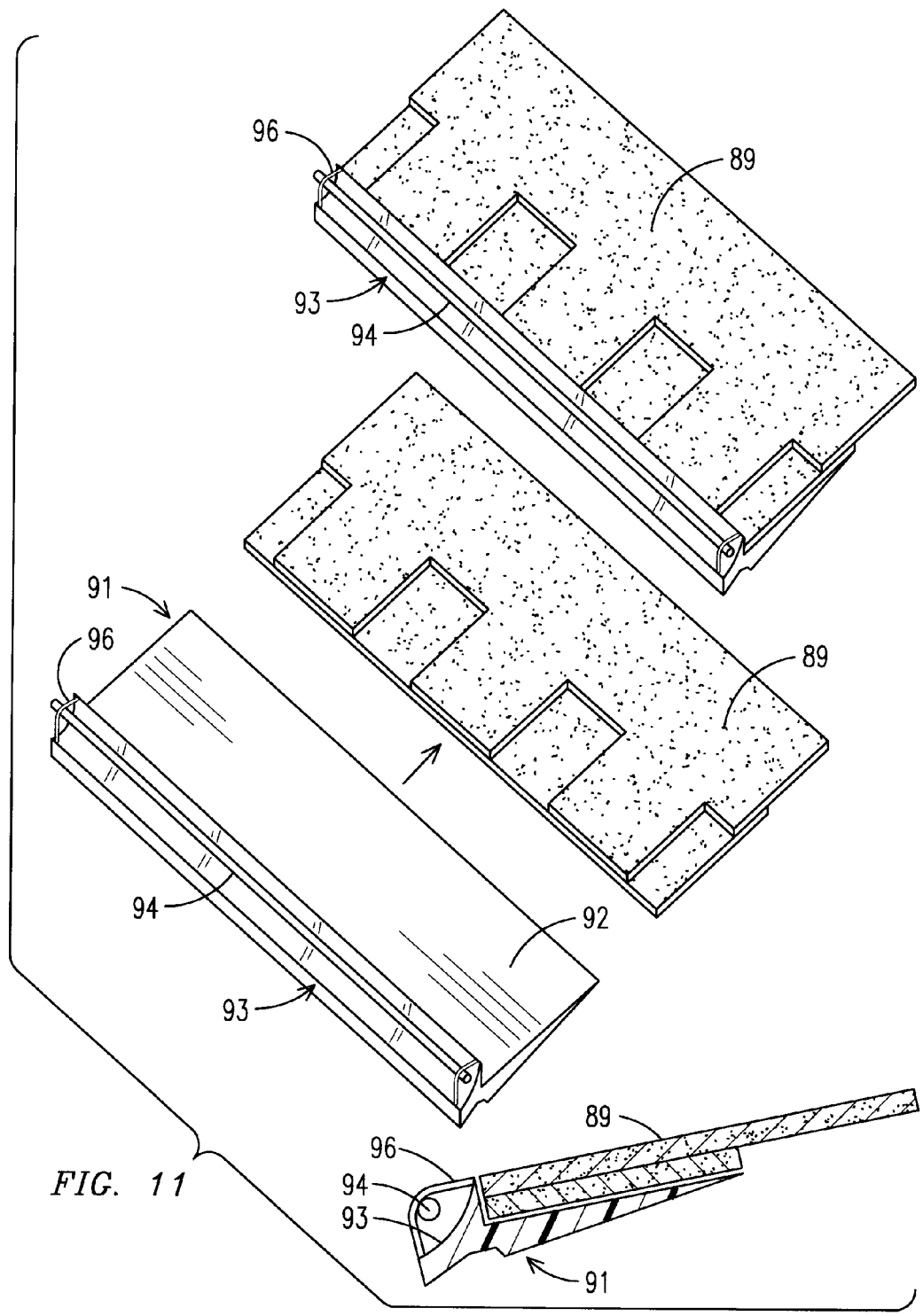
FIG. 11 illustrates another embodiment of a solar insert according to the disclosure including a parabolic reflector that concentrates solar energy onto a collector at its focus.

FIG. 11 illustrates a solar collector of a different configuration for installation on a shingled roof. In this configuration, a solar insert 91 is formed similarly to that of previous embodiments in that it has a wedge-shaped body 92 and a forward surface 93 that resides, when the insert is installed, beneath and along the forward edge of a shingle 89. In this embodiment, however, the forward surface 93 has a parabolic cross-sectional profile and is coated with a mirrored material such as aluminized Mylar or the like. A solar collector 94 is positioned at and extends along the focus of the parabola of the forward surface and is held in position with brackets 96 or other appropriate holders. Solar radiation, which is essentially parallel, falls on the mirrored parabolic surface and is reflected toward the focus of the parabola and onto the solar collector located there. This concentrates all of the radiation falling on the collector onto the solar collector, rendering the solar collector more efficient because the light falling thereon is more intense.

The configuration of FIG. 11 may also be suitable for solar collectors of the type that heat a fluid rather than generate electrical energy. In such a system, the solar collector 94 may be a tube through which a fluid is pumped. As the fluid moves through the collector, the radiation concentrated on the tube by the parabolic reflector heats the fluid in the tube. After a predetermined number of heating cycles, the heated fluid can be stored in an insulated storage vessel for use to heat water, to power a heating system, or otherwise.

The invention has been described in terms of preferred embodiments and methodologies considered by the inventors to represent the best mode of carrying out the invention. A wide variety of additions, deletions, and modification might well be made to the illustrated embodiments by skilled artisans within the scope of the invention. For example, the angled face of the solar insert is preferred, but not necessarily required, to provide the benefits of the invention. The inserts and/or solar collector strips may be longer than a single shingle, or even shorter. While thin-film flexible solar collectors are preferred and illustrated in the preferred embodiments, the invention is not limited to thin film solar technology and traditional wafer-type solar collectors might be used if desired. As mentioned, the solar inserts may be manufactured as an integral element of shingles, which are then installed in substantially the usual way. However, they also may be separate items to be installed before shingles are applied. In such an embodiment, the solar insert can accommodate virtually any manufacture's shingles. One method of installation may be to install and electrically connect courses of solar inserts along the roof using, for example, a batten style system or another appropriate system. Shingles can then be installed in courses atop the already installed solar inserts to complete the roofing job. Safety is a concern because the solar collectors can produce electrical energy in the sunshine during installation. Many solar collectors ganged together can produce potentially dangerous levels of electrical energy. Numerous methods of preventing shock or sparking during installation might be employed, such as keeping the positive and negative terminals of the grid system spaced too far apart for an installer to contact both. Alternatively, opaque removable covers can be applied to the solar collectors, to be removed after installation is complete. Finally, there is a need to cut shingles and their solar inserts in the field such as, for instance, at the ends of each course or to fit shingles to a trough or other structure of the roof. This does not present a particular problem so long as the remaining length of solar collector includes connectors for connecting it to the electrical grid. Alternatively, functioning solar inserts can be discontinued short of the edge of the roof or cut solar collectors that are too short can simply be left out of the grid without significant impact. These and other revisions might be made by those of skill in the art without departing from the spirit and scope of the invention, with is constrained only by the claims.

What is claimed is:

1. A roof comprising:
   a plurality of shingles in at least partially overlapping courses, each shingle having ends, a length from one end to the other end, an upper portion, and a forward edge portion, the forward edge portions of shingles in one course of shingles overlying the upper portions of shingles in a next lower course of shingles so that the forward edge portion of each shingle is exposed;
   the forward edge portion of each shingle terminating in a forward edge;
   a plurality of solar collectors each configured as an elongated rectangular strip having a length substantially the same as the length of a shingle and a width, the solar collectors being located to extend generally parallel with the forward edges of at least some of the plurality of shingles;
   electrical conductors connecting the solar collectors together in a grid for aggregating electrical energy produced by the collectors and delivering it to a remote location; and
   wherein each solar collector is spaced beyond the forward edge of its respective shingle.

2. A roof comprising:
   a plurality of shingles in at least partially overlapping courses, each shingle having ends, a length from one end to the other end, an upper portion, and a forward edge portion, the forward edge portions of shingles in one course of shingles overlying the upper portions of shingles in a next lower course of shingles so that the forward edge portion of each shingle is exposed;
   the forward edge portion of each shingle terminating in a forward edge;
   a plurality of solar collectors each configured as an elongated rectangular strip having a length and a width, the solar collectors being located to extend generally parallel with the forward edges of at least some of the plurality of shingles;
   each solar collector being mounted to an insert that is at least partially disposed beneath and supports a respective shingle and at least partially exposed adjacent the forward edge of the respective shingle, the solar collector being mounted to the exposed portion of the insert to be exposed to solar radiation.

3. A roof as claimed in claim 2 and wherein the insert includes a surface extending beyond the forward edge of the respective shingle and wherein the solar collector is mounted to the surface.

4. A roof as claimed in claim 3 and wherein the surface is angled with respect to the surface of the shingle.

5. A roof as claimed in claim 4 and wherein the angle of the surface is preselected to orient the solar collector for direct exposure to the sun.

6. A roof as claimed in claim 5 and wherein the angle of the surface is preselected based at least in part upon the pitch of the roof.

7. A roof as claimed in claim 5 and wherein the angle of the surface is preselected based at least in part upon the orientation of the roof.

8. A roof as claimed in claim 2 and wherein the insert has a generally wedge-shaped portion that resides beneath the shingle to raise the shingle off of shingles of a next lower course.

9. A roof as claimed in claim 8 and wherein the insert further has a face that is not disposed beneath the shingle, the solar collector being mounted to the face.

10. A roof as claimed in claim 9 and wherein the face extends along the forward edge of the shingle and is angled with respect to the shingle.

11. A roof as claimed in claim 2 and wherein each insert is a unitary component of its respective shingle.

12. A shingle comprising:
   a length, a width, an upper portion, and a forward portion terminating in a forward edge;
   the upper portion being sized to be overlapped by at least part of the forward portion of a like shingle in a next higher course of shingles when the shingle is installed on a roof in courses with like shingles;
   a solar collector configured as an elongated strip having a length and a width;
   the solar collector extending adjacent the forward edge of the shingle with at least a majority of the forward portion of the shingle being exposed; and
   electrical conductors coupled to the solar collector for connecting the solar collector electrically to like solar collectors of like shingles;
   the solar collector being located beyond the forward edge of the shingle.

13. A roof comprising a roof deck and a plurality of shingles according to claim 12 installed in overlapping courses on the roof with the solar collectors of the shingles being electrically coupled together.

* * * * *